(12) United States Patent
Thayer (10) Patent No.: US 7,539,931 B2
(45) Date of Patent: May 26, 2009

(54) STORAGE ELEMENT FOR MITIGATING SOFT ERRORS IN LOGIC

(75) Inventor: Larry J. Thayer, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 753 days.

(21) Appl. No.: 11/102,530

(22) Filed: Apr. 8, 2005

(65) Prior Publication Data

US 2006/0227596 A1 Oct. 12, 2006

(51) Int. Cl.
*G06F 11/08* (2006.01)
(52) U.S. Cl. .................. 714/797; 326/11; 365/154; 365/156; 365/174; 365/177; 365/181
(58) Field of Classification Search ............... 714/797; 326/11; 365/154, 156, 174, 177, 181
See application file for complete search history.

(56) References Cited

U.S. PATENT DOCUMENTS 3,863,215 A 1/1975 McGrogan
4,748,594 A 5/1988 Iida
4,972,415 A * 11/1990 Walter et al. ................ 714/797
6,504,410 B2 1/2003 Waldie et al.

OTHER PUBLICATIONS

U.S. Appl. No. 11/107,526, filed Apr. 15, 2005, Thayer.

* cited by examiner

*Primary Examiner*—Guy J Lamarre (57) ABSTRACT

In a preferred embodiment, the invention provides a method for reducing soft errors in logic. After obtaining two delayed clock signals, the delayed clock signals, the clock signal, and an output from a logic circuit are applied to a triple redundant memory element. The delay of the first delayed clock signal is equal to or greater than the pulse width of a soft error event occurring in the logic circuit. The delay of the second delayed clock signal is equal to or greater than half the pulse width of a soft error event occurring in the logic circuit.

14 Claims, 6 Drawing Sheets

STORAGE ELEMENT FOR MITIGATING SOFT ERRORS IN LOGIC

FIELD OF THE INVENTION

This invention relates generally to logic design. More particularly, this invention relates to improving soft error immunity in logic.

BACKGROUND OF THE INVENTION

High-energy neutrons lose energy in materials mainly through collisions with silicon nuclei that lead to a chain of secondary reactions. These reactions deposit a dense track of electron-hole pairs as they pass through a p-n junction. Some of the deposited charge will recombine, and some will be collected at the junction contacts. When a particle strikes a sensitive region of a latch, the charge that accumulates could exceed the minimum charge that is needed to "flip" the value stored on the latch, resulting in a soft error.

The smallest charge that results in a soft error is called the critical charge of the latch. The rate at which soft errors occur (SER) is typically expressed in terms of failures in time (FIT).

A common source of soft errors are alpha particles which may be emitted by trace amounts of radioactive isotopes present in packing materials of integrated circuits. "Bump" material used in flip-chip packaging techniques has also been identified as a possible source of alpha particles.

Other sources of soft errors include high-energy cosmic rays and solar particles. High-energy cosmic rays and solar particles react with the upper atmosphere generating high-energy protons and neutrons that shower to the earth. Neutrons can be particularly troublesome as they can penetrate most man-made construction (some number of neutrons will pass through five feet of concrete). This effect varies with both latitude and altitude. In London, the effect is two times worse than on the equator. In Denver, Colo. with its mile-high altitude, the effect is three times worse than at sea-level San Francisco. In a commercial airplane, the effect can be 100-800 times worse than at sea-level.

Radiation induced soft errors are becoming one of the main contributors to failure rates in microprocessors and other complex ICs (integrated circuits). Several approaches have been suggested to reduce this type of failure. Adding ECC (Error Correction Code) or parity in data paths approaches this problem from an architectural level. Adding ECC or parity in data paths can be complex and costly. These approaches are not effective for reducing the SER in logic.

There is a need in the art to reduce the SER in logic. An embodiment of this invention reduces the SER in logic

DETAILED DESCRIPTION OF THE PREFERRED EMBODIMENT

Figure 1:
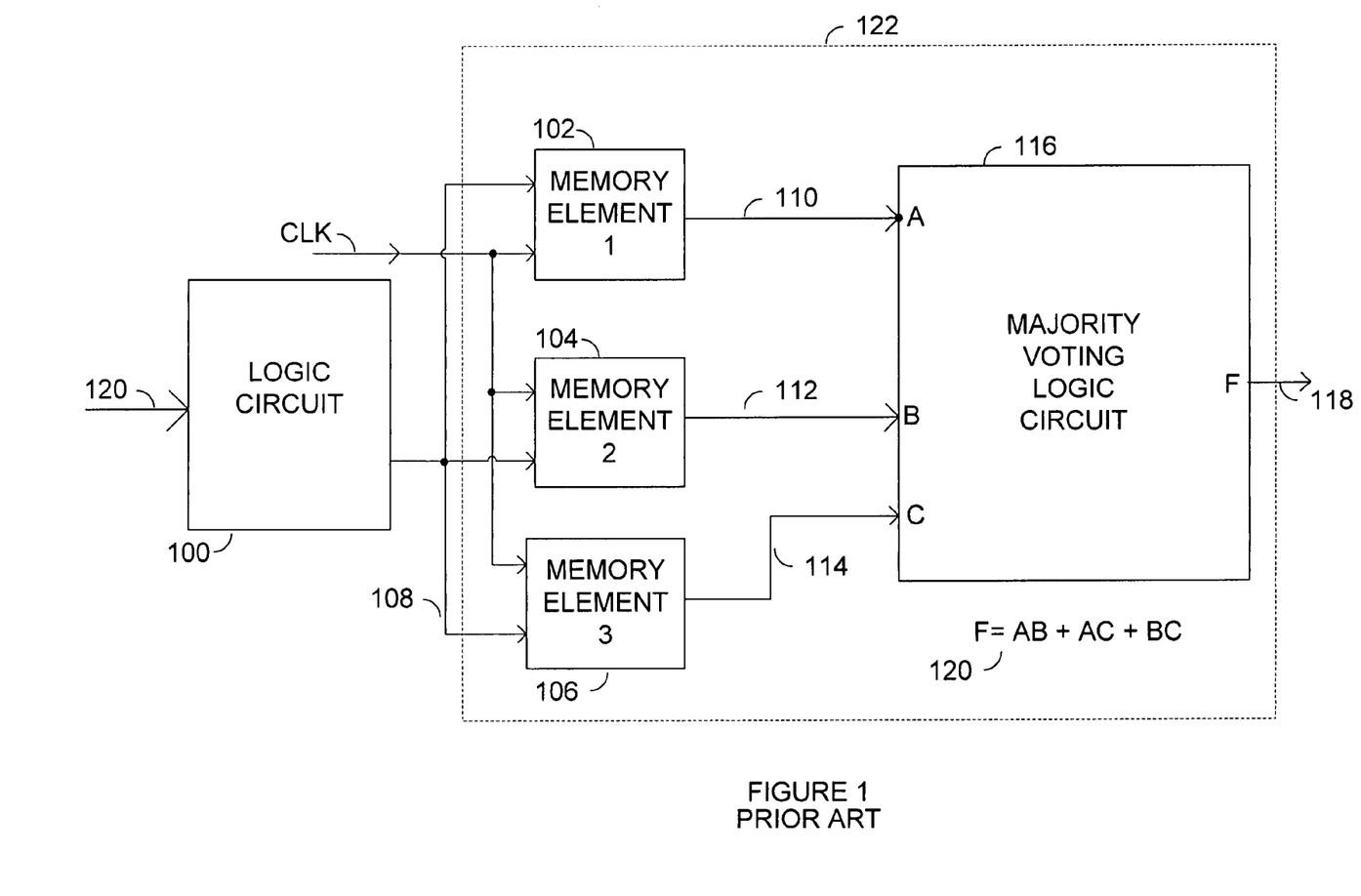
FIG. 1 is a block diagram of a logic circuit and a triple redundant memory element. Prior Art

FIG. 1 is a block diagram of a logic circuit, 100, and a triple redundant memory element, 122. An input, 120, is connected to the input of logic circuit, 100. The output, 108, of the logic circuit, 100, is connected to the data input of memory element 1, 102, memory element 2, 104, and memory element, 106. Clock signal, CLK, controls when the signal on the input, 108, of memory element 1, 102, memory element 2, 104, and memory element 3, 106 is stored in memory element 1, 102, memory element 2, 104, and memory element 3, 106. The signal, 110, stored in memory element 1, 102, is presented at the input, A, of majority voting logic circuit, 116. The signal, 112, stored in memory element 2, 104, is presented at the input, B, of majority voting logic circuit, 116. The signal, 114, stored in memory element 3, 106, is presented at the input, C, of majority voting logic circuit, 116. A triple redundant memory element, 122, includes memory elements, 102, 104, 106, and majority voting logic circuit, 116.

The majority voting logic circuit, 116, contains the following Boolean logic:

$$F = AB + AC + BC$$

This logic assures that when two or more of the inputs (110, 112, or 114) are of the same logic value, that logic value is presented at the output, 118. As a result, if identical logic values are stored in memory elements 1, 2, and 3 (102, 104, and 106 respectively), and subsequently a soft error event changes one of the three memory elements (102, 104, or 106) to the opposite logic value, the original logic value stored in all three memory elements, (102, 104, and 106) will be maintained on the output, 118, of the majority voting logic circuit, 116. The circuit show in FIG. 1, however, does not correct soft errors occurring in the logic circuit, 100.

Figure 2A:
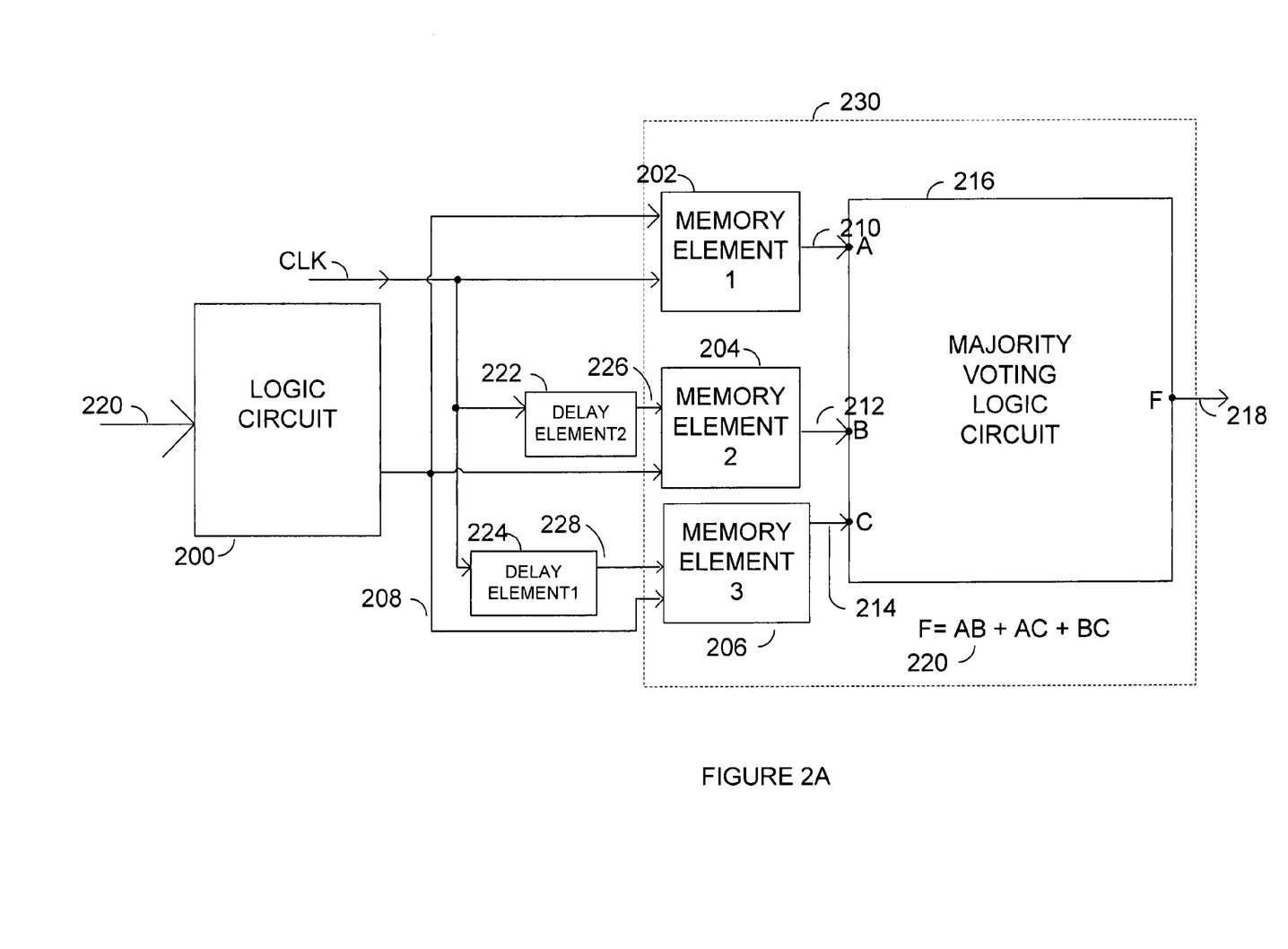
FIG. 2A is a block diagram of a logic circuit, two delay elements, and a triple redundant memory element.

FIG. 2 is a block diagram of a logic circuit, 200, two delay elements, 222 and 224, and a triple redundant memory element, 230. An input, 220, is connected to the input of logic circuit, 200. The output, 208, of the logic circuit, 200, is connected to the data input of memory element 1, 202, memory element 2, 204, and memory element 3, 206. Clock signal, CLK, is connected to memory element 1, 202, delay element 2, 222, and delay element 1, 224. The output, 226, of delay element 2, 222, is connected to memory element 2, 204. The output, 228, of delay element 1, 224, is connected to memory element 3, 206. The signal, 210, stored in memory element 1, 202, is presented at the input, A, of majority voting logic circuit, 216. The signal, 212, stored in memory element 2, 204, is presented at the input, B, of majority voting logic circuit, 216. The signal, 214, stored in memory element 3, 206, is presented at the input, C, of majority voting logic circuit, 216. Delay elements 1 and 2, 222 and 224, may be implemented, for example, using a chain of inverters or a combination of resistors and capacitors in a pi-network. Memory elements 1, 2, and 3, 202, 204, and 206, may be implemented, for example, using a pulsed latch, an SRAM cell, a DRAM cell or a D-type flip-flop. A triple redundant memory element, 230, includes memory elements, 202, 204, 206, and majority voting logic circuit, 216.

The majority voting logic circuit, 216, contains the following Boolean logic:

$$F = AB + AC + BC$$

This logic assures that when two or more of the inputs (210, 212, or 214) are of the same logic value, that logic value is presented at the output, 218. As a result, if identical logic values are stored in memory elements 1, 2, and 3 (202, 204, and 206 respectively), and subsequently a soft error event changes one of the three memory elements (202, 204, or 206) to the opposite logic value, the original logic value stored in all three memory elements, (202, 204, and 206) will be maintained on the output, 218, of the majority voting logic circuit, 216. The circuit shown in FIG. 2 does correct soft errors occurring in the logic circuit, 200.

Figure 3:
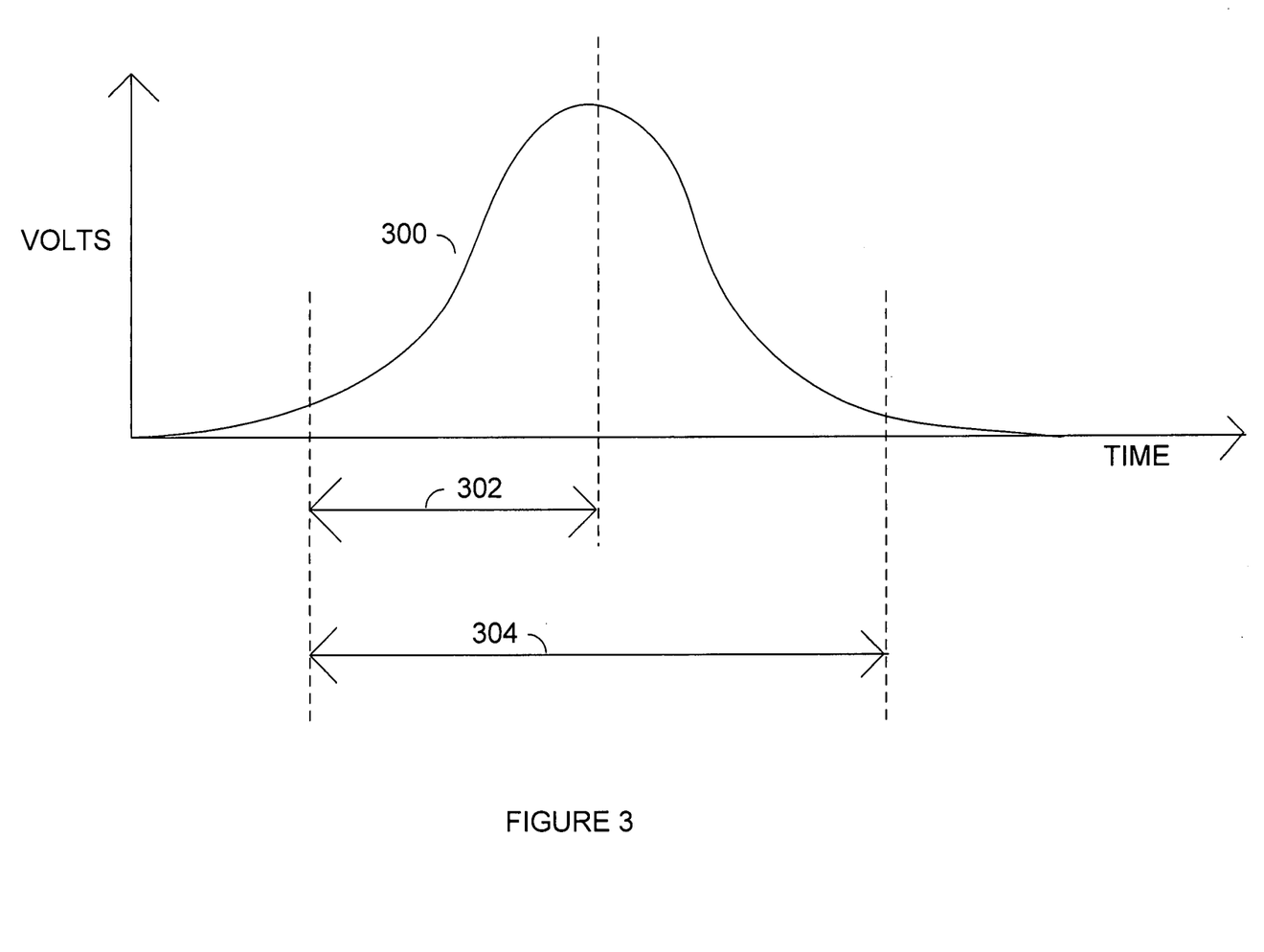
FIG. 3 is a drawing of the pulse width of a soft error event.

FIG. 3 is a drawing of the pulse width, 304, of a soft error event, 300. The time delay in delay elements 1 and 2 (224 and 222 respectively) are determined by the pulse width, 304, and the half pulse width, 302, respectively, shown in FIG. 3.

The time delay in delay element 1, 224, is equal to or greater than one pulse width of the soft error event, 304. The time delay in delay element 2, 222, is equal to one half or greater of the pulse width of the soft error event, 302. Because the CLK signal to memory elements 2 and 3 (204 and 206) is delayed by half the pulse width or greater, 302, and by the full pulse width or greater, 304, respectively, the value of the logic, 208, captured by memory elements 2 and 3 (204 and 206) is delayed by half the pulse width or greater, 302, and by the full pulse width or greater, 304, respectively. Creating these delays, 222 and 224, causes the original logical value, 208, created by the logic circuit, 200, to be stored in two of the three memory elements (202, 204, or 208) at all times during a soft error event, 300. Because two of the three memory elements (202, 204, or 208), during a soft error event, 300, contain the original logical value presented on node 208, the majority voting logic circuit, 216, maintains the original logical value on its output, 218.

For example, (see FIG. 2B for a timing diagram), if the logic circuit, 200, creates a logical zero on its output, 208, at the beginning of a clock cycle and a soft error event, 300, occurs that changes the output, 208, to a logical one, memory element 1, 202, will contain a logical zero, 210, at the beginning of the soft error event, 300. Memory element 2, 204, because the clock signal, CLK, is delayed by half of a pulse width or greater, 222, of a soft error event, 300, still retains the logical value from the previous clock cycle, a logical one. Memory element 3, 206, because the clock signal, CLK, is delayed by the pulse width or greater, 224, of a soft error event, 300, still retains the logical value from the previous clock cycle, a logical one.

Figure 2B:
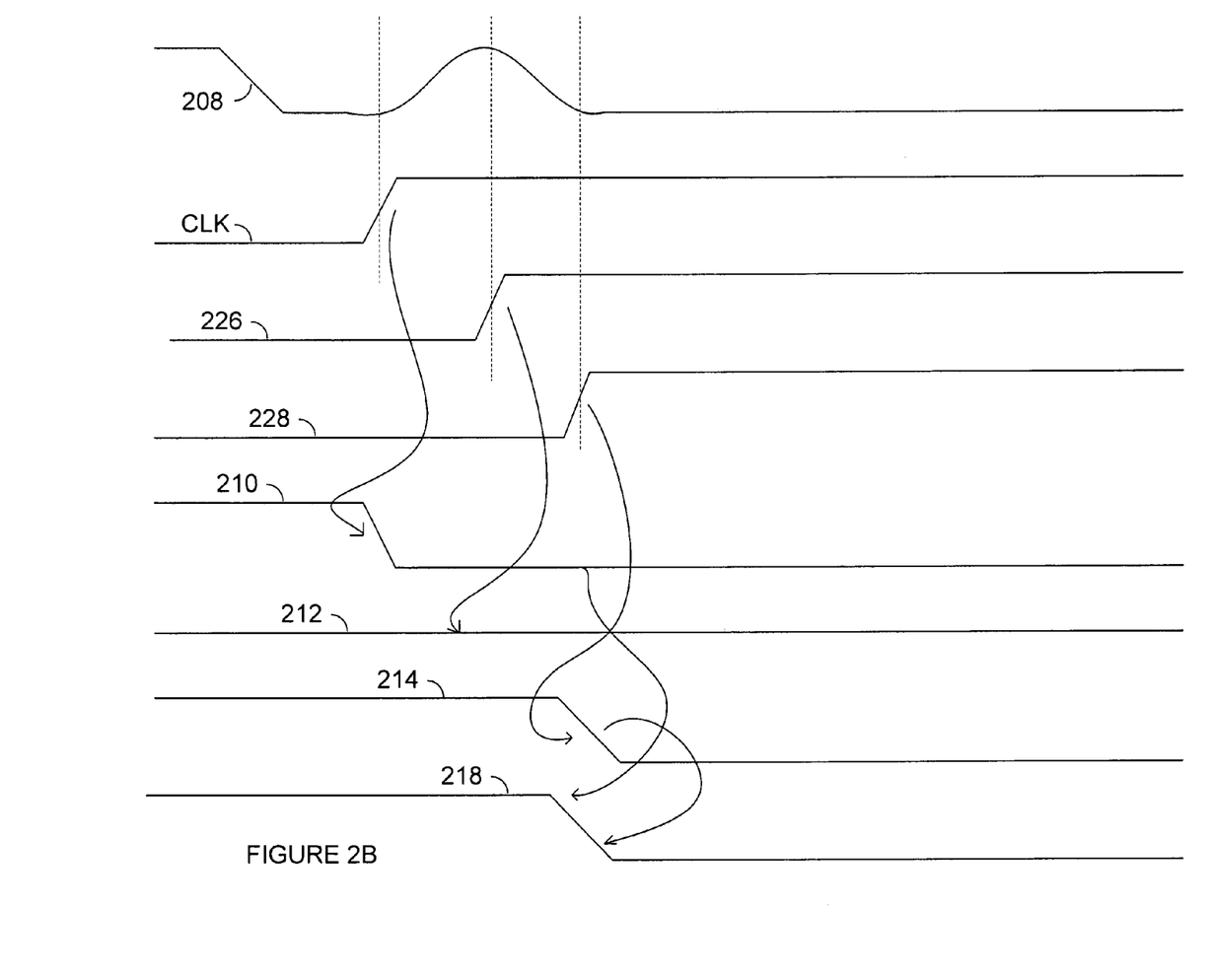
FIG. 2B is a timing diagram showing the relative timing of the soft error event, CLK, delayed clocks, and the resulting logic.

After a time equal to half the pulse width or greater, 222, of the soft error event, 300, memory element 1, 202, still contains a logical zero, 210, memory element 2, 204, because of the clock delay in delay element 2, 222, will capture a logical one, 212, and memory element 3, 206, still retains the logical value from the previous clock cycle, a logical one. After a time equal to the pulse width or greater, 224, of the soft error event, 300, memory element 1, 202, still contains a logical zero, 210, memory element 2, 204, still contains a logical one, 212, and memory element 3, 206, captures a logical zero, 214. Since memory element 1, 202, contains a logical zero, 210 and memory element 3, 206, contains a logical zero, 214, after the soft error event, the majority voting logic circuit, 216, will create a logical zero at its output, 218. As a result, the original logical value, zero, produced by the logic circuit, 200, is maintained despite a soft error, 300, in the logic circuit, 200.

Figure 4:
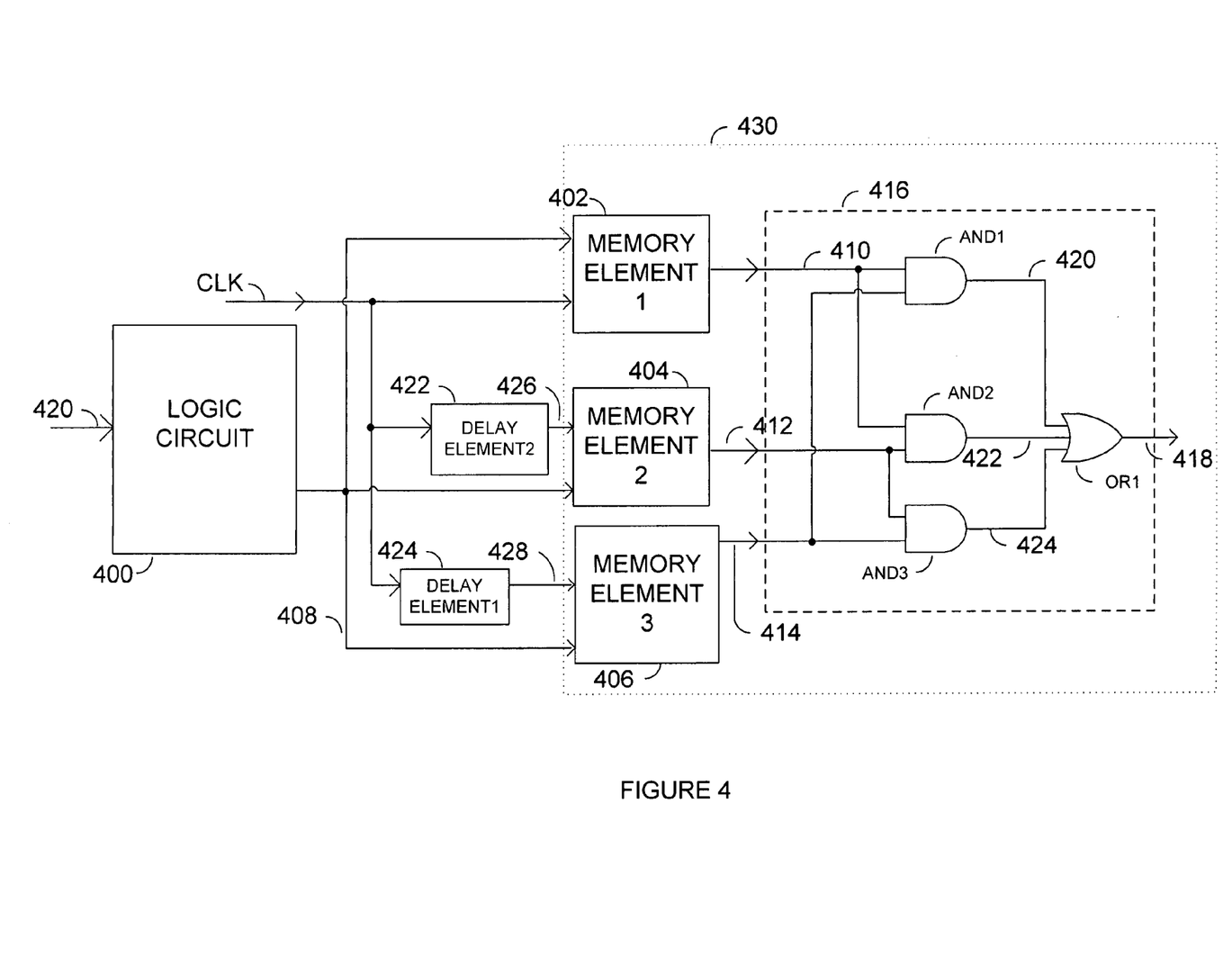
FIG. 4 is a block diagram of a logic circuit, two delay elements, a triple redundant memory element.

FIG. 4 is a block diagram of a logic circuit, 400, two delay elements, 422 and 424, and a triple redundant memory element, 430. In this embodiment of the invention, the majority voting logic circuit, 416, comprises three AND gates, AND1, AND2, and AND3, and an OR gate, OR1. An input, 420, is connected to the input of logic circuit, 400. The output, 408, of the logic circuit, 400, is connected to the data input of memory element 1, 402, memory element 2, 404, and memory element 3, 406. Clock signal, CLK, is connected to memory element 1, 402, delay element 2, 422, and delay element 1, 424. The output, 426, of delay element 2, 422, is connected to memory element 2, 404. The output, 428, of delay element 1, 424, is connected to memory element 3, 406. A triple redundant memory element, 430, includes memory elements, 402, 404, 406, and majority voting logic circuit, 416.

The signal, 410, stored in memory element 1, 402, is presented at an input of AND1 and an input of AND2, of majority voting logic circuit, 416. The signal, 412, stored in memory element 2, 404, is presented at an input of AND2 and an input of AND3, of majority voting logic circuit, 416. The signal, 414, stored in memory element 3, 406, is presented at an input of AND1 and an input of AND3, of majority voting logic circuit, 416. The output, 420, of AND gate, AND1, is connected to an input of OR gate, OR1. The output, 422, of AND gate, AND2, is connected to an input of OR gate, OR1. The output, 424, of AND gate, AND3, is connected to an input of OR gate, OR1. The output, 418, of OR gate, OR1, is connected to the output, 418, of the majority voting logic circuit, 416.

Figure 5:
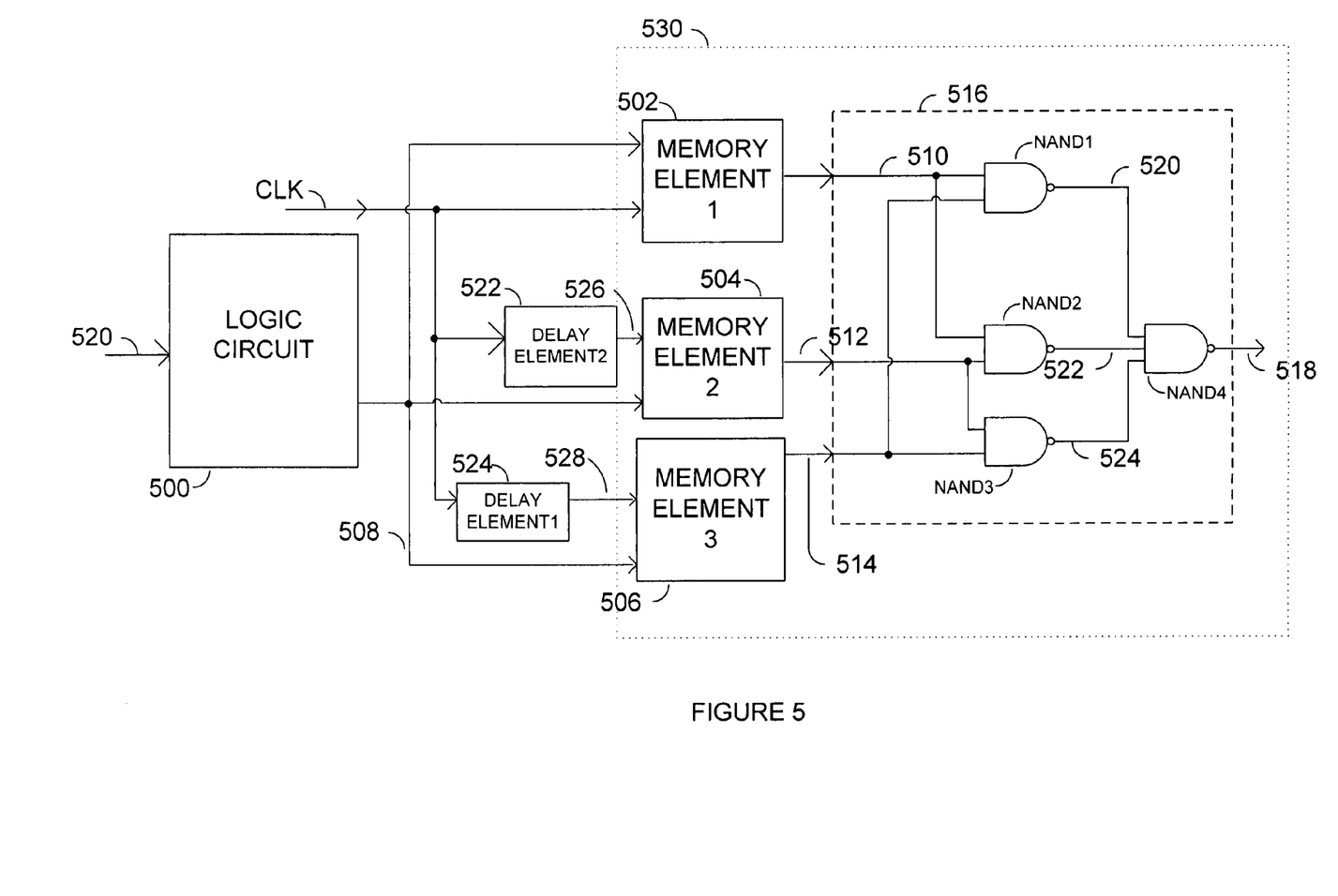
FIG. 5 is a block diagram of a logic circuit, two delay elements, and a triple redundant memory element.

FIG. 5 is a block diagram of a logic circuit, 500, two delay elements, 522 and 524, a triple redundant memory element, 530. In this embodiment of the invention, the majority voting logic circuit, 516, comprises four NAND gates, NAND1, NAND2, NAND3 and NAND4. An input, 520, is connected to the input of logic circuit, 500. The output, 508, of the logic circuit, 500, is connected to the data input of memory element 1, 502, memory element 2, 504, and memory element 3, 506. Clock signal, CLK, is connected to memory element 1, 502, delay element 2, 522, and delay element 1, 524. The output, 526, of delay element 2, 522, is connected to memory element 2, 504. The output, 528, of delay element 1, 524, is connected to memory element 3, 506. A triple redundant memory element, 530, includes memory elements, 502, 504, 506, and majority voting logic circuit, 516.

The signal, 510, stored in memory element 1, 502, is presented at an input of NAND1 and an input of NAND2, of majority voting logic circuit, 516. The signal, 512, stored in memory element 2, 504, is presented at an input of NAND2 and an input of NAND3, of majority voting logic circuit, 516. The signal, 514, stored in memory element 3, 506, is presented at an input of NAND1 and an input of NAND3, of majority voting logic circuit, 516. The output, 520, of NAND gate, NAND1, is connected to an input of NAND gate, NAND4. The output, 522, of NAND gate, NAND2, is connected to an input of NAND gate, NAND4. The output, 524, of NAND gate, NAND3, is connected to an input of NAND gate, NAND4. The output, 518, of NAND gate, NAND4, is connected to the output, 518, of the majority voting logic circuit, 516.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for reducing soft errors in logic comprising:
   obtaining a first delayed clock signal;
   obtaining a second delayed clock signal;
   applying a clock signal, the first delayed clock signal, the second delayed clock signal and a data output from a logic circuit to a triple redundant memory element;
   wherein the time delay of the first delayed clock signal is equal to or greater than the pulse width of a soft error event occurring in the logic circuit;
   wherein the time delay of the second delayed clock is equal to or greater than half the pulse width of a soft error event occurring in the logic circuit;
   wherein an original logic value on the data output from the logic circuit before a soft error occurs is maintained on an output of the triple redundant memory element after the soft error occurs;
   wherein the triple redundant memory element comprises:
      three memory elements;
      a majority voting logic circuit;
      wherein an output from each memory element is connected to a separate input of the majority voting logic circuit;
      wherein the clock signal is connected to a first memory element;
      wherein the first delayed clock signal is connected to a second memory element;
      wherein the second delayed clock signal is connected to a third memory element.

2. The method as in claim 1 wherein the memory elements are DRAMS.

3. The method as in claim 1 wherein the memory elements are SRAMs.

4. The method as in claim 1 wherein the memory elements are D-type flip-flops.

5. The method as in claim 1 wherein the memory elements are pulsed latches.

6. The method as in claim 1 wherein the majority voting logic circuit comprises:
   three two-input NANDs;
   one three-input NAND;
   wherein each output from the three two-input NANDs are connected to an input of the three-input NAND.

7. The method as in claim 1 wherein the majority voting logic circuit comprises:
   three two-input ANDs;
   one three-input OR;
   wherein each output from the three two-input ANDs are connected to an input of the three-input OR.

8. A circuit for reducing soft errors in logic comprising:
   a first delay element;
   a second delay element;
   a triple redundant memory element;
   wherein a clock signal is applied to the first delay element, the second delay element, and to a triple redundant memory element;
   wherein an output of a logic circuit is applied to the triple redundant memory element;
   wherein the time delay of the first delayed clock signal is equal to or greater than the pulse width of a soft error event occurring in the logic circuit;
   wherein the time delay of the second delayed clock is equal to or greater than half the pulse width of a soft error event occurring in the logic circuit;
   wherein an original logic value on the data output from the logic circuit before a soft error occurs is maintained on an output of the triple redundant memory element the soft error occurs;
   wherein the triple redundant memory element comprises:
      three memory elements;
      a majority voting logic circuit;
      wherein an output from each memory element is connected to a separate input of the majority voting logic circuit;
      wherein the clock signal is connected to a first memory element;
      wherein the first delayed clock signal is connected to a second memory element;
      wherein the second delayed clock signal is connected to a third memory element.

9. The circuit as in claim 8 wherein the memory elements are DRAMS.

10. The circuit as in claim 8 wherein the memory elements are SRAMs.

11. The circuit as in claim 8 wherein the memory elements are D-type flip-flops.

12. The circuit as in claim 8 wherein the memory elements are pulsed latches.

13. The circuit as in claim 8 wherein the majority voting logic circuit comprises:
   three two-input NANDs;
   one three-input NAND;
   wherein each output from the three two-input NANDs are connected to an input of the three-input NAND.

14. The circuit as in claim 8 wherein the majority voting logic circuit comprises:
   three two-input ANDs;
   one three-input OR;
   wherein each output from the three two-input ANDs are connected to an input of the three-input OR.

* * * * *

UNITED STATES PATENT AND TRADEMARK OFFICE
CERTIFICATE OF CORRECTION

PATENT NO. : 7,539,931 B2
APPLICATION NO. : 11/102530
DATED : May 26, 2009
INVENTOR(S) : Larry J. Thayer It is certified that error appears in the above-identified patent and that said Letters Patent is hereby corrected as shown below:

In column 6, line 18, in Claim 8, after "element" insert -- after --.

Signed and Sealed this

Sixth Day of April, 2010

David J. Kappos
*Director of the United States Patent and Trademark Office*